United States Patent [19]

Lange et al.

[11] Patent Number: 4,651,183

[45] Date of Patent: Mar. 17, 1987

[54] HIGH DENSITY ONE DEVICE MEMORY CELL ARRAYS

[75] Inventors: Russell C. Lange, Wappingers Falls, N.Y.; Roy E. Scheuerlein, Burlington, Vt.

[73] Assignee: International Business Machines Corporation, Armonk, N.Y.

[21] Appl. No.: 625,403

[22] Filed: Jun. 28, 1984

[51] Int. Cl.[4] ............... H01L 29/78; H01L 27/02; H01L 27/10

[52] U.S. Cl. .......................... 357/23.6; 357/41; 357/45

[58] Field of Search .................. 357/23.6, 41, 45

[56] References Cited

U.S. PATENT DOCUMENTS

| 4,012,757 | 5/1977 | Koo | 357/24 |
|---|---|---|---|
| 4,125,854 | 11/1978 | McKenny et al. | 357/41 |
| 4,240,195 | 12/1980 | Clemens et al. | 357/23.6 |
| 4,287,571 | 9/1981 | Chakravarti et al. | 365/104 |
| 4,376,983 | 3/1983 | Tsaur et al. | 365/53 |
| 4,388,121 | 6/1983 | Rao | 357/23.6 |
| 4,476,547 | 10/1984 | Miyasaka | 357/23.6 |
| 4,482,908 | 11/1984 | Henderson | 357/23.6 |
| 4,491,858 | 1/1985 | Kawamoto | 357/23.6 |

Primary Examiner—Gene M. Munson
Attorney, Agent, or Firm—Stephen J. Limanek

[57] ABSTRACT

A memory is provided which includes a semiconductor substrate having a diffusion region disposed therein, first, second, third and fourth storage capacitors, first, second, third and fourth switching or transfer devices for coupling the first, second, third and fourth storage capacitors, respectively, to the diffusion region, a common conductor connected to the diffusion region and means for selectively activating the switching devices. In a more specific aspect of this invention, a plurality of groups of the four storage capacitors are arranged so that each of these capacitors is selectively coupled to the common conductor. In another aspect of this invention, the storage capacitors of the plurality of groups are arranged in parallel rows with the common conductor arranged obliquely to the direction of the rows of storage capacitors.

18 Claims, 6 Drawing Figures

HIGH DENSITY ONE DEVICE MEMORY CELL ARRAYS

TECHNICAL FIELD

This invention relates to integrated semiconductor circuits and more particularly to arrays of one device memory cells having a high cell density.

BACKGROUND ART

Integrated semiconductor circuits including arrays or memories having, e.g., single transistor cells have achieved high cell densities.

In U.S Pat. No. 4,012,757, filed May 5, 1975, there is disclosed a one device per bit memory wherein the storage devices are grouped in pairs and share a common gate member and a common capacitive plate.

U.S. Pat. No. 4,125,854, filed Dec. 2, 1976, teaches a static random access memory array wherein a common drain supply node is centrally disposed within a group of four mutually contiguous cells.

Commonly assigned U.S. Pat. No. 4,287,571, filed on Sept. 11, 1979, by S. N. Chakravarti and J. A. Hiltebeitel, discloses a dense read only memory (ROM) having one contact shared by four cells.

U.S. Pat. No. 4,376,983, filed Mar. 21, 1980, describes an array of one device dynamic memory cells which uses three levels of polysilicon with zigzag lines to achieve high density.

DISCLOSURE OF THE INVENTION

It is an object of this invention to provide an improved low cost, high density array of one device dynamic memory cells having a higher transfer ratio between storage capacitor and bit line capacitance due to an improved cell layout and reduced bit line lengths.

In accordance with the teachings of this invention, a memory is provided which includes a semiconductor substrate having a diffusion region disposed therein, first, second, third and fourth storage capacitors, first, second, third and fourth switching or transfer devices coupling the first, second, third and fourth storage capacitors, respectively, to the diffusion region, a common conductor connected to the diffusion region and means for selectively activating the switching devices. In a more specific aspect of this invention, a plurality of groups of the four storage capacitors are arranged so that each of these capacitors is selectively coupled to the common conductor. In another aspect of this invention, the storage capacitors of the plurality of groups are arranged in parallel rows with the common conductor arranged obliquely to the direction of the rows of storage capacitors.

The foregoing and other objects, features and advantages of the invention will be apparent from the following and more particular description of the preferred embodiments of the invention, as illustrated in the accompanying drawings.

BEST MODE FOR CARRYING OUT THE INVENTION

Figure 1:
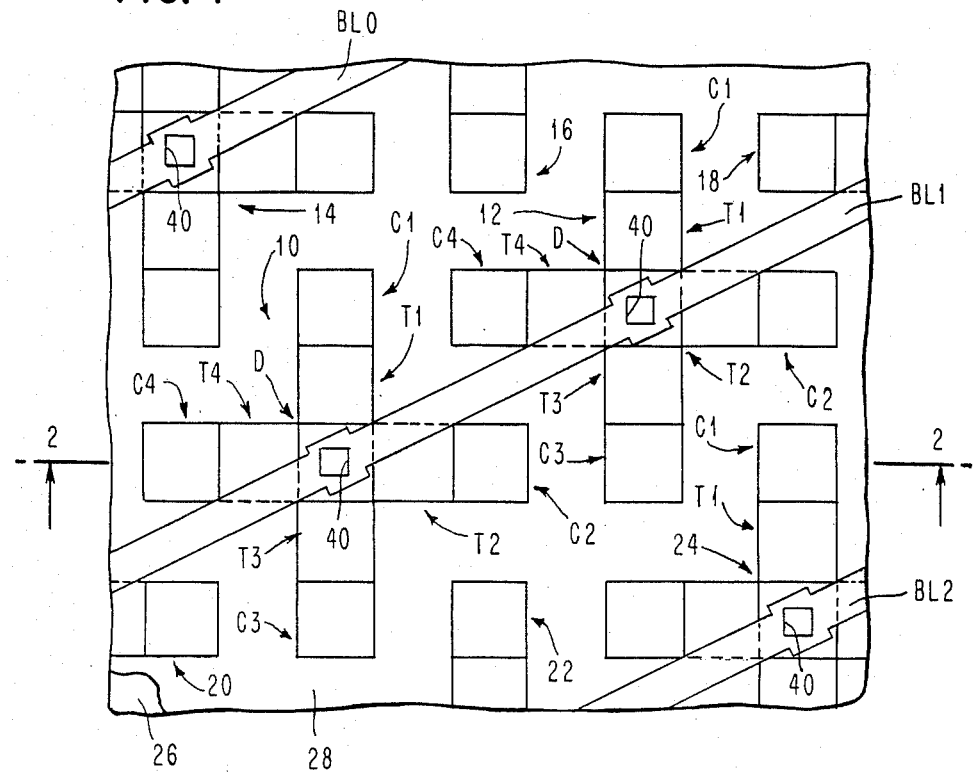
FIG. 1 is a plan view of a one device dynamic memory cell array of the present invention.
Figure 2:
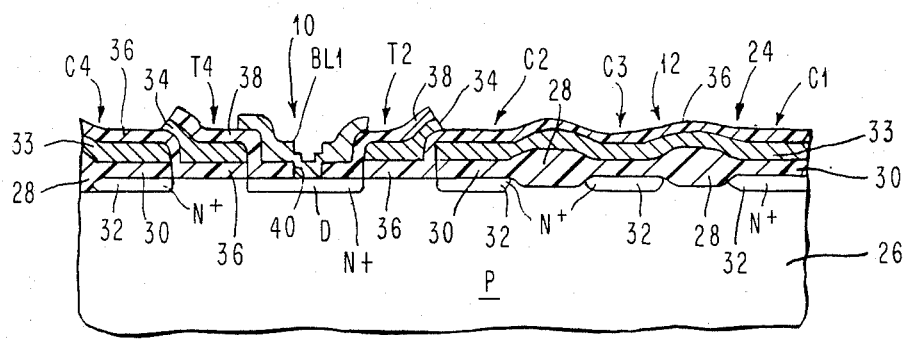
FIG. 2 is a sectional view of the array of FIG. 1 taken through line 2—2 thereof.

Referring to the drawings in more detail, there is shown in FIG. 1 a plan view of a one device dynamic memory cell array of the present invention and in FIG. 2 a sectional view of the array of FIG. 1 taken through line 2—2 of FIG. 1. As can be seen in FIGS. 1 and 2, a plurality of groups of one device dynamic memory cells 10, 12, 14, 16, 18, 20, 22 and 24 are shown, at least in part, formed on a semiconductor substrate 26, preferably made of silicon. Disposed on the substrate 26 and between the memory cell groups 10, 12, 14, 16, 18, 20, 22 and 24 is a thick oxide or silicon dioxide layer 28 which may be formed in any known manner to provide appropriate isolation. Each of the groups of cells, such as group 10, includes a common N+ diffusion region D, storage capacitors C1, C2, C3 and C4 and transfer devices T1, T2, T3 and T4, preferably field effect transistors, arranged to couple the storage capacitors to the common diffusion region D. A thin insulating layer 30, preferably made of silicon dioxide, is grown on the substrate 26 adjacent to the thick oxide layer 28, as seen more clearly in FIG. 2 of the drawings. Each of the storage capacitors includes an N+ diffusion region or N type inversion region 32 and a plate formed by a first layer 33 of polysilicon with the thin dielectric layer 30 of silicon dioxide interposed therebetween. Second and third layers of polysilicon are used to provide gate electrodes for the transfer devices. One of the two polysilicon layers 34 is used for the gate electrodes of devices T2 and T4 and the other of the two polysilicon layers, not shown in FIGS. 1 and 2, is provided for forming gate electrodes for devices T1 and T3 of the group 10. A suitable insulating layer 36, such as silicon dioxide, is grown to isolate polysilicon layer 33 from polysilicon layer 34. The insulating layer 36 may also be used to form the gate dielectric of the transfer devices T2 and T4. Another suitable insulating layer 38, such as silicon dioxide, is also grown to isolate polysilicon layer 34 from the other of the two gate electrode polysilicon layers. Bit/sense lines BL0, BL1 and BL2 preferably made of copper-doped aluminum, are deposited over the polysilicon layers and insulated therefrom by the layer 38 of silicon dioxide. Bit/sense lines BL0, BL1 and BL2 contact common diffusion region D through openings 40 in the silicon dioxide layer 38.

Figure 3:
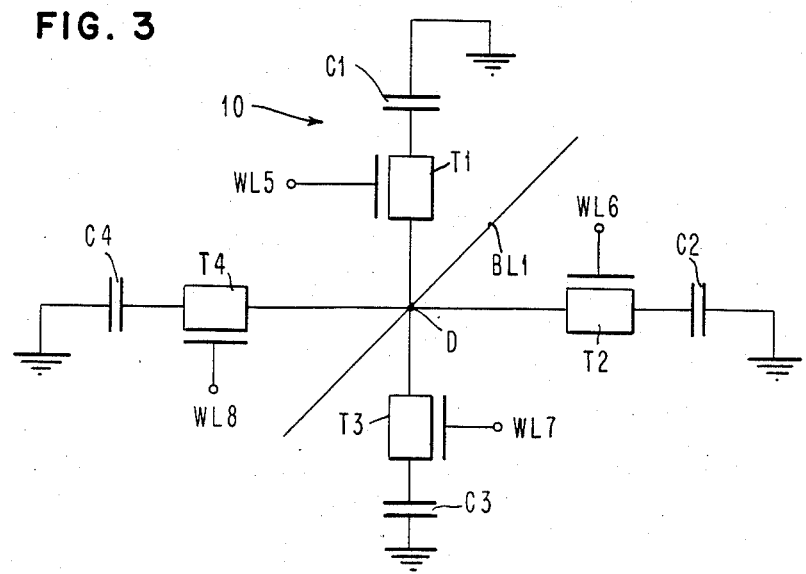
FIG. 3 is a schematic diagram of one group of cells shown in FIG. 1.

In FIG. 3 there is shown a schematic diagram of the group 10 of one device memory cells illustrated in FIGS. 1 and 2 of the drawings. As can be seen, group 10 includes a first memory cell having storage capacitor C1, transfer device T1 and common diffusion region D, a second memory cell having storage capacitor C2, transfer device T2 and common diffusion region D, a third memory cell having storage capacitor C3, transfer device T3 and common diffusion region D and a fourth memory cell having storage capacitor C4, transfer device T4 and common diffusion region D. Transfer device T2, having a gate electrode made of polysilicon layer 34, is connected to a word line WL6 and transfer device T4, having a gate electrode also made of polysilicon layer 34, is connected to a word line WL8. The gate electrodes of transfer devices T1 and T3 are connected to word lines WL5 and WL7, respectively.

In the operation of the array illustrated in FIGS. 1, 2 and 3, it can be seen that, e.g., by selectively applying an appropriate word pulse to word lines WL5, WL6, WL7 or WL8 of group 10, data applied to bit/sense line BL1 from an external data source may be stored in any one of the storage capacitors C1, C2, C3 or C4 of group 10. Also, by coupling an appropriate sense amplifier to bit/sense line BL1 and turning on a desired one of the transfer devices T1, T2, T3 or T4, data stored in any one of the storage capacitors C1, C2, C3 and C4 can be readily detected.

It should be noted that by arranging the bit/sense lines as indicated more clearly in FIG. 1, the length of the bit/sense lines is shorter than in known one device memory cell arrays to provide a higher transfer ratio between the storage capacitors and the bit/sense line capacitance. To better understand the advantages of the present invention, the lithography limit may be designated as L and thus all shapes and spaces are set at a length L. For example, the area of each storage cell is $L^2$, as is each transfer device and also each N+ diffusion region D. Accordingly, a conventional one device memory cell, such as disclosed in the above-identified U.S. Pat. No. 4,376,983, requires six lithography squares or an area of $6L^2$, i.e., one square for the storage capacitor, one for the transfer device, one-half for the diffusion region, which is shared between two cells, and three and one-half for the isolation region. However, it can be seen that in the layout of the array of the present invention, one cell occupies only five lithography squares with the diffusion region D being shared by four cells. Key to this layout is the placement of a plurality of transfer devices, preferably four devices, around each diffusion region D, or bit/sense line contact area, in such a way that the array of cells is built up without wasting surface area on the substrate or chip, i.e. the cells' shape must tile a plane, while coupling the storage capacitors to the diffusion region. With four transfer devices around each contact, all cells may be formed by using three levels or layers of polysilicon. It should be noted that the equal sided cross shape arrangement illustrated in FIG. 1 tiles the entire plane.

This cell layout not only increases array density with a given capacitor size, but it also significantly reduces the bit/sense line capacitance per cell, with reduced bit/sense line diffusion contact regions, when compared with conventional cell layouts. The reduced bit/sense line capacitance is due to the shorter length of the bit/sense line between contact points. It can be seen that the contact spacing is equal to $\sqrt{(4L^2)+(2L^2)}$ or about 4.5 L. Since each contact is shared by 4 cells, the effective length of the bit line per cell is about 1.1 L. which is much shorter than the bit/sense line length in the conventional layout of 3 L per bit or cell. This arrangement allows an increase in cells per bit/sense line in the array or a decrease in capacitor size while maintaining the same signal level. With, e.g., twice as many cells on a bit/sense line, the number of sense amplifiers and column decoders is reduced by 50%, which saves about 30% of the peripheral circuit area. This savings is in addition to a 20% denser array, resulting in a chip area reduction of about 25%. This cell layout is compatible with the folded bit line arrangement or multiplexed sense amplifier techniques by simply changing the bit/sense line metal wiring between contacts so that the wiring by-passes every second contact along its length.

As indicated hereinabove, with four cells having a common diffusion region D, as shown in FIG. 1 of the drawings, four unique word lines are required around the bit/sense line diffusion or contact region D for conventional one device random access memory operation. Two of these four word lines may be formed from the layer 34 of polysilicon, with the storage nodes under the first polysilicon layer 33, and the other two word lines may be formed from a third level or layer of polysilicon.

Figure 4:
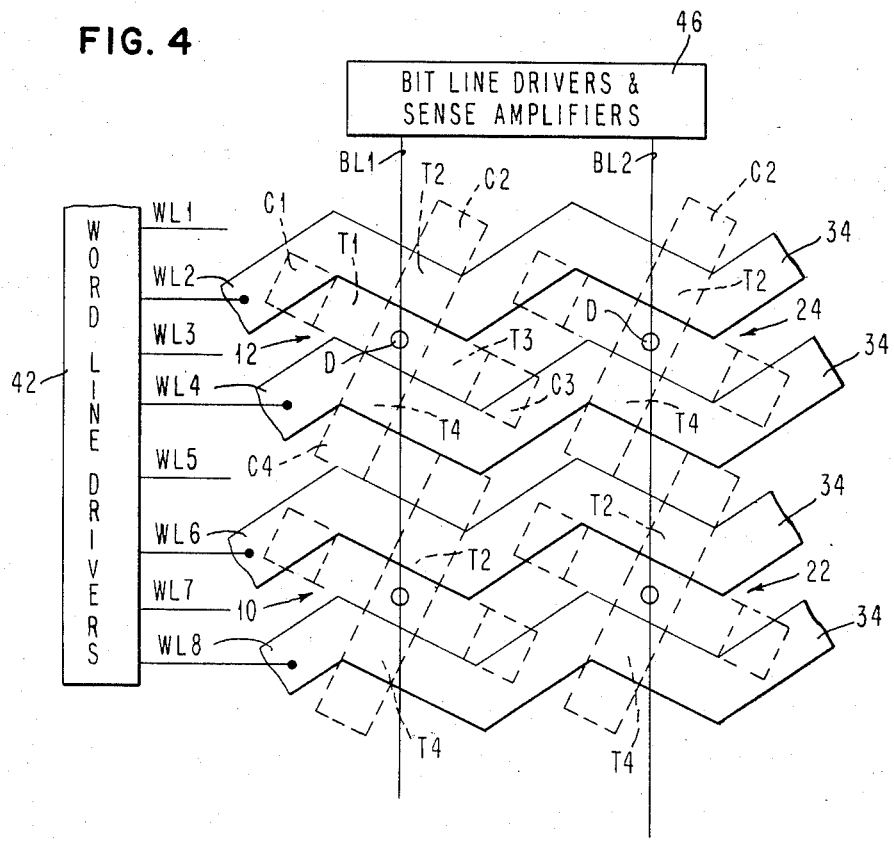
FIG. 4 is a plan view of some of the word lines used to control the array of FIG. 1.
Figure 5:
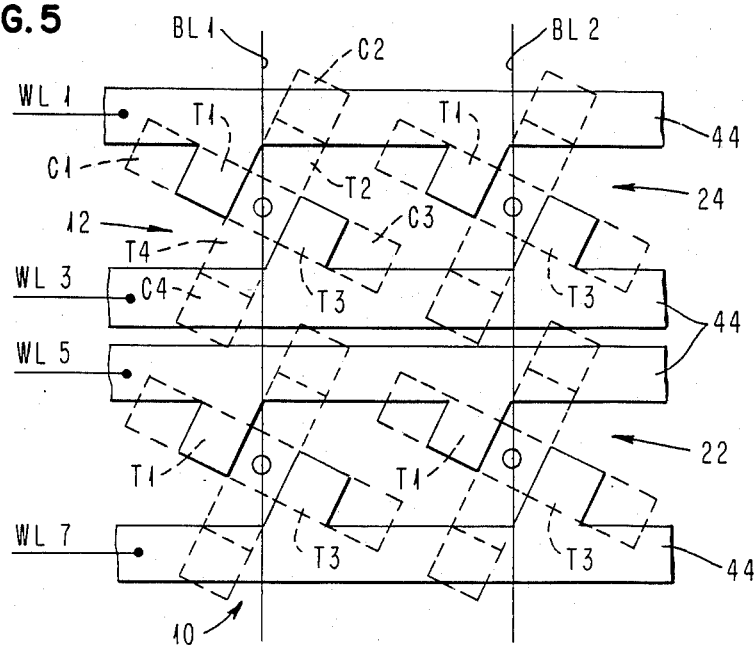
FIG. 5 is a plan view of the remaining word lines used to control the array of FIG. 1.
Figure 6:
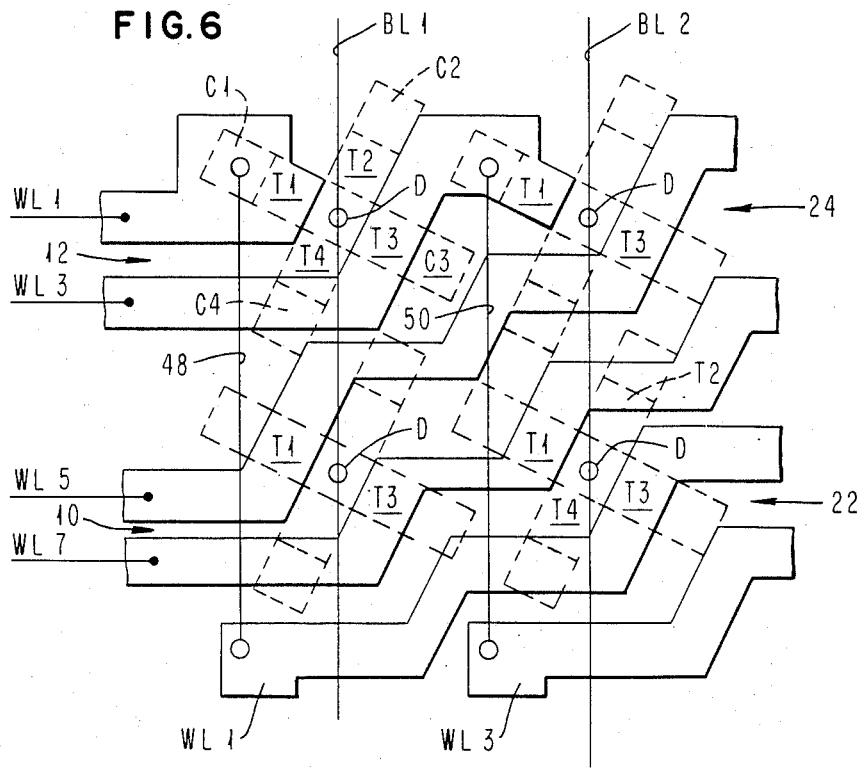
FIG. 6 is a plan view of an alternate arrangement of the remaining word lines which may be used to control the array of FIG. 1.

To illustrate the arrangement of word lines around the N+ diffusion region D, reference may be had to FIGS. 4, 5 and 6 of the drawings, which show portions of arrays of the present invention, each being similar to that of FIG. 1 and with similar elements being identified by the same reference characters.

As shown in FIG. 4 of the drawings, word line WL2, made in a zigzag fashion from the layer of polysilicon 34 and connected to conventional word line drivers 42, forms gate electrodes for transfer devices T2 of groups 12 and 24 and word line WL4 forms gate electrodes for transfer devices T4 of groups 12 and 24. Likewise, word lines WL6 and WL8 form gate electrodes for transfer devices T2 and T4, respectively, of groups 10 and 22. As can be seen in FIG. 5 of the drawings, word line WL1, made in substantially a straight line from a polysilicon layer 44 and also connected to the word line drivers 42, forms, with the use of tabs or projecting segments, gate electrodes for transfer devices T1 of groups 12 and 24 and word line WL3 forms gate electrodes for transfer devices T3 of groups 12 and 24. Likewise, word lines WL5 and WL7 form gate electrodes for transfer devices T1 and T3, respectively, of groups 10 and 22. Of course, word lines WL1, WL3, WL5 and WL7 made from polysilicon layer 44 and word lines WL2, WL4, WL6 and WL8 made from polysilicon layer 34 are superimposed one upon the other over the semiconductor substrate 26, however, in the interest of clarity, word lines WL2, WL4, WL6 and WL8 have been omitted from FIG. 5 of the drawings. It should be noted in FIGS. 4 and 5 that the bit/sense line BL1 contacting groups 10 and 12 and the bit/sense BL2 contacting groups 22 and 24 are connected to conventional bit line drivers and sense amplifiers 46 and are arranged generally perpendicular to the direction of the word lines.

There are other possible array arrangements which may be preferred in any given groundrule set. For example, word lines WL1, WL3, WL5 and WL7 shown in FIG. 5 may be replaced by the arrangement of word lines WL1, WL3, WL5 and WL7 shown in FIG. 6 wherein the word lines traverse the array in a generally diagonal direction with vertical metal straps 48 and 50 used to interconnect appropriate segments of these word lines. It can be seen in FIG. 6 that word line WL1 serves not only transfer device T1 of group 12 but also, via metal strap 48, transfer device T3 of group 22. Likewise, word line WL3 in FIG. 6 serves transfer device T3 of group 12 and transfer device T1 of group 24, and, via strap 50, other transfer devices not shown. Word line WL5 serves transfer device T1 of group 10 and transfer device T3 of group 24 and word line WL7 serves transfer device T3 of group 10 and transfer device T1 of group 22. The bit/sense lines BL1 and BL2 in FIG. 6 are arranged in a similar manner to that shown in FIG. 5.

It can be seen that a dense one device memory cell array is provided which may use very small storage capacitors and wherein substantially the entire array area is utilized for the cell structure except for the necessary thick isolation required between the cells.

Although there is illustrated in the figures of the drawings only a few cells associated with each word line, it should be understood that, if desired, hundreds of cells may be associated with each word line and that the number of word lines may also be increased to at least several hundred. Furthermore, although the illustrated embodiments have been described as having a P-type substrate, it should be noted that an N-type substrate may be used, if desired, by interchanging the conductivities, such as the N and P regions in the substrate, as is known.

While the invention has been particularly shown and described with reference to preferred embodiments thereof, it will be understood by those skilled in the art that various changes in form and details may be made therein without departing from the spirit and scope of the invention.

What is claimed is:

1. A memory comprising
   a semiconductor substrate having a plurality of diffusion regions, each having a given size and a given shape, and
   a plurality of groups of cells, each group including four cells and each cell having a storage capacitor of substantially said given size and said given shape and a switching device coupling said storage capacitor to a respective one of said diffusion regions.

2. A memory comprising
   a semiconductor substrate having a plurality of diffusion regions, and
   a plurality of groups of cells, each group including four cells and each cell having a storage capacitor and a switching device coupling said storage capacitor to a respective one of said diffusion regions, one of the storage capacitors of a first of said groups being disposed adjacent to and between a storage capacitor of a second and of a third group of cells.

3. A memory as set forth in claim 2 wherein said diffusion regions and said groups of cells are arranged in a plurality of columns and further including a plurality of bit/sense lines and a plurality of word lines, one of said bit/sense lines being connected to each of the diffusion regions of a respective column of said plurality of columns of diffusion regions and one of said word lines being connected to one of the switching devices of each of said plurality of columns of cell groups.

4. A memory as set forth in claim 3 wherein said bit/sense line is a metallic line and said one word line has a zigzag configuration and is made of polysilicon.

5. A memory as set forth in claim 2 wherein said plurality of word lines includes a first set of word lines and a second set of word lines, said first set of word lines being coupled to two of said four cells of each of said groups and said second set being of word lines being coupled to the remaining two of said four cells.

6. A memory as set forth in claim 5 wherein said first set of word lines are polysilicon lines arranged in a first layer over said substrate and said second set of word lines are polysilicon lines arranged in a second layer over said substrate.

7. A memory as set forth in claim 6 wherein the lines of said first set of word lines and the lines of said second set of word lines are arranged generally in parallel to each other and orthogonal to said bit/sense lines.

8. A memory as set forth in claim 6 wherein the lines of said first set of word lines are diagonal to the lines of said second set of word lines and to said bit/sense lines.

9. A memory as set forth in claim 8 wherein each of the lines of said second set of word lines includes a plurality of segments and a metallic strap interconnects said segments.

10. A memory as set forth in claim 6 wherein a plate of each of said storage capacitors is a polysilicon plate arranged in a third layer over said substrate.

11. A memory as set forth in claim 10 wherein said groups are isolated from each other by a recessed oxide.

12. A memory comprising
    a semiconductor substrate having a common diffusion region of a given area on the surface of said substrate disposed therein,
    first, second, third and fourth storage capacitors, each of said capacitors having substantially said given area on the surface of said substrate, and
    first, second, third and fourth switching devices coupling said first, second, third and fourth storage capacitors, respectively, to said diffusion region, said first and third capacitors and said first and third switching devices being aligned along a first axis through said common diffusion region and said second and fourth capacitors and said second and fourth switching devices being aligned along a second axis through said common diffusion region, said second axis intersecting said first axis.

13. A memory as set forth in claim 12 wherein said storage capacitors include storage nodes disposed within said substrate and plates made of a first layer polysilicon and said switching devices are field effect transistors having gate electrodes made of second and third layers of polysilicon and further including a bit/sense line made of a conductive metallic material contacting said diffusion region.

14. A memory as set forth in claim 13 wherein said common diffusion region and said storage nodes are N+ diffusion regions and said substrate has a P type conductivity.

15. A memory comprising
    a semiconductor substrate having a common diffusion region disposed therein,
    first, second, third and fourth storage capacitors, said storage capacitors including storage nodes disposed within said substrate and plates made of a first layer of polysilicon, said common diffusion region and said storage nodes being N+ diffusion regions and said substrate having a P type conductivity,
    first, second, third and fourth switching devices coupling said first, second, third and fourth storage capacitors, respectively, to said diffusion region, said switching devices being field effect transistors having gate electrodes made of second and third layers of polysilicon, said first and third capacitors and said first and third switching devices being aligned along a first axis through said common diffusion region and said second and fourth capacitors and said second and fourth switching devices being aligned along a second axis through said common diffusion region orthogonal to said first axis, and
    a bit/sense line made of a conductive metallic material contacting said diffusion region.

16. A memory array comprising
a semiconductor substrate and
first and second groups of cells, each of said groups including a diffusion region formed in said substrate, first, second, third and fourth storage nodes and switching means for selectively coupling said storage nodes to the associated diffusion region, said first and third storage node of said first group and said fourth storage node of said second group being aligned along a first axis through the diffusion region of said first group and said first and third storage nodes of said second group and said second storage node of said first group being aligned along a second axis through the diffusion region of said second group, said first and second axes being parallel to each other.

17. A memory as set forth in claim 16 further including a bit/sense line connected between the diffusion regions of said first and second groups and wherein said switching means includes first, second, third and fourth word lines for selectively coupling a respective one of said first, second, third and fourth storage nodes of one of said first and second groups to the diffusion region of said one group.

18. A memory as set forth in claim 16 wherein said switching means includes first, second, third and fourth field effect transistors disposed between said first, second, third and fourth storage nodes, respectively, of said one group and the diffusion region of said one group, and said storage nodes are disposed within said substrate.

* * * * *